US006951803B2

(12) United States Patent
Tzeng et al.

(10) Patent No.: US 6,951,803 B2
(45) Date of Patent: Oct. 4, 2005

(54) METHOD TO PREVENT PASSIVATION LAYER PEELING IN A SOLDER BUMP FORMATION PROCESS

(75) Inventors: Kai Tzeng, Ping-Tung (TW);
Cheng-Ming Wu, Tainan (TW);
Chu-Wei Hu, Taichung (TW);
Jung-Lieh Hsu, Tainan (TW);
Kuei-Yuam Hsu, Tainain (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 20 days.

(21) Appl. No.: 10/788,739

(22) Filed: Feb. 26, 2004

(65) Prior Publication Data

US 2005/0191836 A1     Sep. 1, 2005

(51) Int. Cl.[7] ............................................. H01L 21/44
(52) U.S. Cl. ..................... 438/612; 438/663; 438/907
(58) Field of Search ................................ 438/612, 613, 438/614, 628, 637, 663, 791, 907, 909

(56) References Cited

U.S. PATENT DOCUMENTS 4,293,435 A * 10/1981 Portugall et al. ...... 252/299.01
6,884,156 B2 * 4/2005 Prasad et al. .............. 451/533

* cited by examiner

Primary Examiner—Phuc T. Dang
(74) Attorney, Agent, or Firm—Tung & Associates

(57) ABSTRACT

A method for reducing peeling of a cross-linked polymer passivation layer in a solder bump formation process including providing a multi-level semiconductor device formed on a semiconductor process wafer having an uppermost surface comprising a metal bonding pad in electrical communication with underlying device levels; forming a layer of resinous pre-cursor polymeric material over the process surface said resinous polymeric material having a glass transition temperature (Tg) upon curing; subjecting the semiconductor process wafer to a pre-curing thermal treatment temperature below Tg for a period of time; and, subjecting the semiconductor process wafer to at least one subsequent thermal treatment temperature above Tg for a period of time to form an uppermost passivation layer.

20 Claims, 2 Drawing Sheets

METHOD TO PREVENT PASSIVATION LAYER PEELING IN A SOLDER BUMP FORMATION PROCESS

FIELD OF THE INVENTION

This invention generally relates to semiconductor processing including under bump metallurgy (UBM) formation in flip chip bonding technology and more particularly to formation of a polymer passivation layer to avoid gas bubble formation and subsequent peeling in a solder bump formation process.

BACKGROUND OF THE INVENTION

Packaging of the ULSI chip is one of the most important steps in ULSI manufacturing, contributing significantly to the overall cost, performance and reliability of the packaged chip. As semiconductor devices reach higher levels of integration, packaging technologies such as chip bonding have become critical. Packaging of the chip accounts for a considerable portion of the cost of producing the device and failure of the package leads to costly yield reduction.

One of the major problems leading to package failure in UBM formation are caused by the requirement for high temperature thermal treatments and compatibility of materials to withstand high temperature thermal treatments, for example during a curing or a solder reflow process. For example, in flip chip technology chip bonding is accomplished by means of solder bumps formed on under bump metallurgy (UBM) layers overlying a chip bonding pad where, frequently, high thermal treatments necessary to achieve solder reflow can lead to damage if underlying organic materials.

One problem with prior art UBM formation processes is the tendency of the polymer layer 14 to become detached and peel in subsequent processes or following a wet stripping process to remove the photoresist, for example dry film photoresist, used the photolithographic patterning and etching process to pattern the UBM system layers.

There is therefore a need in the semiconductor processing art to develop an improved solder bump formation process whereby peeling of the passivation layer is avoided to improve a process wafer yield and improve the reliability a solder bump (ball) formation process.

It is therefore an object of the invention to provide an improved solder bump formation process whereby peeling of passivation layer is avoided to improve a process wafer yield and improve the reliability a solder bump (ball) formation process, while overcoming other shortcomings and limitations of the prior art.

SUMMARY OF THE INVENTION

To achieve the foregoing and other objects, and in accordance with the purposes of the present invention, as embodied and broadly described herein, the present invention provides a method for reducing peeling of a cross-linked polymer passivation layer in a solder bump formation process.

In a first embodiment, the method includes providing a multi-level semiconductor device formed on a semiconductor process wafer having an uppermost surface comprising a metal bonding pad in electrical communication with underlying device levels; forming a layer of resinous pre-cursor polymeric material over the process surface said resinous polymeric material having a glass transition temperature (Tg) upon curing; subjecting the semiconductor process wafer to a pre-curing thermal treatment temperature below Tg for a period of time; and, subjecting the semiconductor process wafer to at least one subsequent thermal treatment temperature above Tg for a period of time to form an uppermost passivation layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to a solder bump formation process where a polyimide passivation layer is included as the uppermost passivation layer underlying a UBM system, it will be appreciated that other curable polymer resins producing a cross-linked polymer structure upon exposure to thermal energy and where gaseous species are generated in a curing (energy exposure) process at a temperature above a glass transition temperature (Tg) may also be used as the upper most passivation layer in the method of the present invention. The method of the present invention advantageously avoids the formation of gas pockets or bubbles generated during the curing process above Tg to improve a wafer yield and device reliability in a semiconductor micro-integrated circuit manufacturing process including a solder bump formation process.

Figure 1A:
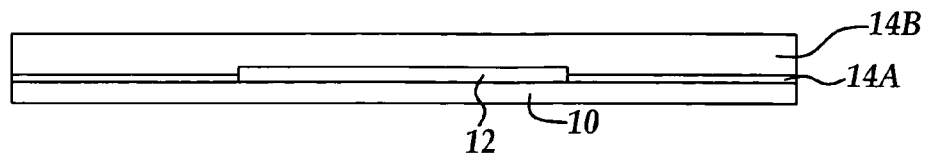
FIGS. 1A–1D are cross-sectional representations of an exemplary process for forming a solder bump at selected stages in a manufacturing process according to an embodiment of the present invention.

Referring to FIGS. 1A–1D are representative cross-sectional views at stages in a manufacturing process according to an embodiment of the present invention for creating a solder bump structure for use in flip chip bonding technology. Referring to FIG. 1A, the process of creating the solder bumps begins after forming chip bonding pad 12, for example formed of Cu, Al or alloys thereof, typically formed by vapor deposition over an upper level 10 of a multi-level semiconductor device, for example an underlying insulating dielectric layer including metal interconnect lines (not shown) for electrically communicating with underlying levels of the integrated circuit.

After the chip bonding pad 12 is formed, one or more passivation layers are formed, for example, a first layer of silicon nitride (SiN) 14A, followed by an overlying uppermost passivation layer 14B formed of a material preferably having a glass transition temperature (Tg) between about 200° C. and about 300° C., preferably greater than about 240° C. The passivation layer is preferably formed by depositing a flowable resinous polymer precursor followed by a pre-curing thermal treatment process and a thermal curing process above Tg to produce a polymer cross-linked structure. By the term "cross-linked" is meant a polymer structure having a crystalline-like structure including cross-linked chemical bonding between precursor polymeric resin groups.

In one embodiment, the cross-linked polymer layer is a polyimide and has a glass transition temperature greater than about 240° C., preferably between about 240° C. and about 300° C. It will be appreciated that polyimide materials are well known and may be formed to have different glass transition temperatures depending on additives present such as a polyamic acid and siloxanes used in conventional polyimide resin formation processes.

For example, the uppermost cross-linked polymer passivation layer 14B is formed by depositing a flowable resinous layer of polymer precursor resin in a conventional coating process, for example a spin coating process, followed by a thermal treatment processes to cross-link and harden the polymer resin to form the cross-linked polymer passivation layer 14B. For example, the cross-linked polymer passivation layer is formed at a thickness of about 5 microns to about 15 microns following a curing process.

In an aspect of the present invention, the polymer precursor resin layer is subjected to a pre-curing thermal treatment (baking process) below a glass transition temperature (Tg) prior to a thermal curing treatment (curing process) above Tg. Preferably the process wafer including the polymer precursor resin layer is heated in the pre-curing baking process prior to the curing process to a temperature lower than Tg, preferably within about 20° C. to about 100° C. of Tg for a period of time, for example from about 1/5 to about 1/30 of the curing process time carried out above Tg.

During the curing process, the temperature of the process wafer including the polymer precursor resin layer is increased to a temperature higher than Tg, preferably from about 40° C. to about 100° C. higher than Tg for carrying out the curing process. Preferably, the pre-curing baking process and the curing process are carried out in an inert gas atmosphere, for example nitrogen, and optionally, about 20% to about 5% hydrogen. The heat source may be any conventional heating source including hot plate or furnace. Optionally, the pre-curing baking process and the curing process may include a temperature ramp of from about 15° C. to about 60° C. per minute to ensure a more uniform temperature profile over the polymer precursor resin layer.

In another embodiment, the pre-curing baking process may include heating the process wafer to a temperature below Tg for a period of time followed by a second heating process above Tg but not greater than about 40° C. above Tg for a period of time. For example, in the first heating step of the pre-curing baking process, the process wafer is heated to a temperature within about 60° C. below Tg for a period of time followed by increasing the wafer temperature equal to or above Tg, but not greater than about 40° C. above Tg for about an equal period of time, the total pre-curing baking process time period being about 1/5 to about 1/30 of the curing process time. The curing process is then carried out at a temperature greater than about 40° C. above Tg.

In one embodiment, the polymer precursor resin is a polyimide, preferably with a Tg between about 200° C. to about 300° C., more preferably from about 240° C. to about 300° C. Preferably, the process wafer with the polyimide precursor resin layer is heated in the pre-curing baking process to a temperature of between about 180° C. and 220° C. for a time period of about 3 minutes to about 10 minutes prior to the curing process. The curing process is then preferably carried out, for example in-situ or at a separate curing station, at a temperature from about 320° C. to about 370° C. for a period of about 90 minutes to about 180 minutes, more preferably from about 115 minutes to about 135 minutes.

For example, it has been found that gaseous species, for example nitrogen and/or hydrogen, are released during a curing process to form entrapped gas bubbles in the cross-linked polymer passivation layer which tend to produce surface defects in subsequently deposited overlying layers including UBM metallurgy layer. It is believed that the gaseous bubbles are entrapped in the cross-linked polymer layer during the curing process and move and coalesce over time to form larger gaseous bubbles to form protruding defects at the process wafer surface, including displacing overlying layers. Subsequent processes including UBM formation and patterning, as explained below, are believed to initiate peeling of the cross-linked polymer passivation layer, for example a polyimide layer, by penetration of chemicals, for example acidic or basic chemicals used in a wet stripping process to remove photoresist, for example dry film photoresist.

While not being bound by the precise mechanism, it is believed that polymer cross-linking reactions generate gaseous species, for example hydrogen and/or nitrogen within the polymer resin layer during a curing process. For example, the polymer layer curing process is typically carried out at temperatures significantly higher than Tg to accelerate and complete the curing process. For example, polyimide materials having a Tg of about 260° C. are typically cured at a temperature of about 350 ° C. to about 400° C. It has been found that curing processes above Tg according to the prior art result in the formation of entrapped gaseous bubbles within the polymer layer which are believed to be the result of premature hardening of an upper portion of the polymer layer to block gas diffusion before the generated gas can diffuse out of the polymer layer.

According to the pre-curing baking process of the present invention, polymer cross-linking reactions are initiated at temperatures lower than Tg for a period of time where the rate of polymer cross-linking reactions is slower but generate a significant amount of gas in the initial cross-linking process. By carrying out initial polymer cross-linking reactions at lower temperatures than the curing process, including lower than the Tg, sufficient time is allowed for at least partial diffusion of gas generated species out of the polymer layer prior to hardening of an upper portion of the polymer layer thereby allowing the subsequent curing process at higher temperatures to complete the polymer structure formation process (e.g., cross-linking) with reduced generation of entrapped of gaseous bubbles within the polymer layer.

Figure 1B:
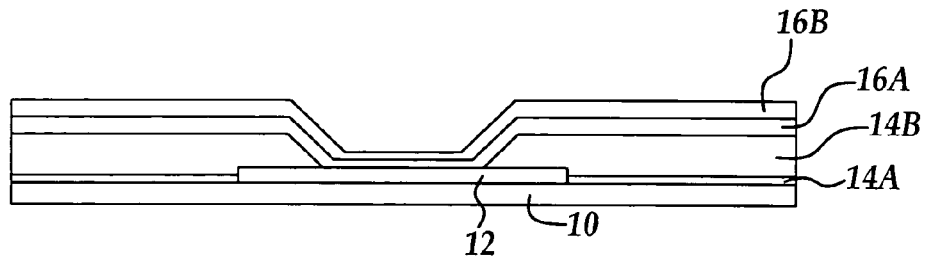

Referring to FIG. 1B, following the pre-curing and curing thermal treatments, a conventional patterning and dry or wet etching process is carried out to remove a portion of the passivation layer e.g., 14A to form an opening over and exposing the bonding pad 12. Following exposure of the bonding pad 12, one or more UBM layers are deposited over the wafer surface. In an exemplary embodiment, two UBM layers are formed, a lowermost UBM adhesion layer 16A formed of at least one of titanium, chromium, or aluminum, and uppermost UBM wetting layer 16B formed of at least one of Cu, CrCu, Ni, and NiV. The UBM layers 16A and 16B are deposited by conventional PVD sputtering processes to a thickness between about 500 Angstroms and about 2500 Angstroms.

Figure 1C:
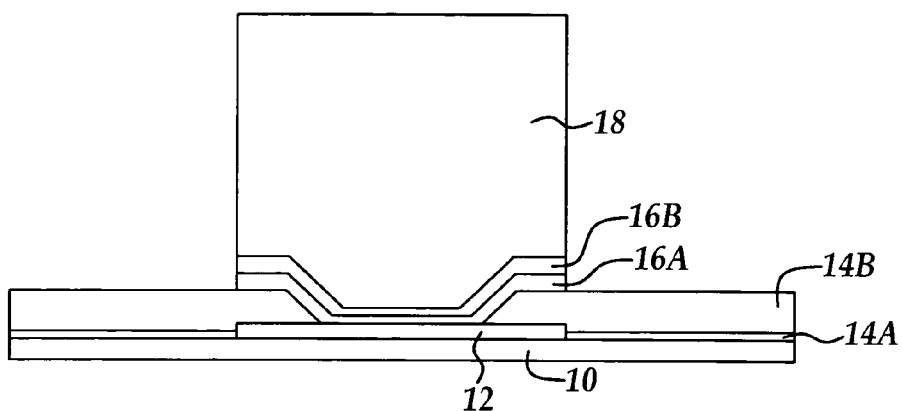

Referring to FIG. 1C, according to an embodiment of the present invention, a photolithographic patterning process, for example depositing and patterning dry film resist layer 18, is carried out to form a DFR layer 18 portion covering at least a portion of the bonding pad 12. Following the patterning process, a plasma assisted etching process, for example reactive ion etching (RIE), is carried out to etch away the uncovered portions of the UBM metal layers 15A and 16B to expose the uppermost passivation layer 14B to form UBM metal layer portions overlying the bonding pad 12 including overlying a portion of the passivation layer 14B overlapping the bonding pad 12 edges.

Following the UBM metal layer etching process, a DFR stripping process including a wet stripping process is carried out, for example, including an ashing process followed by a wet stripping process to complete removal of the DFR layer 18. For example, the wet stripping process preferably includes at least one of an acidic and a basic solution to remove the DFR.

Figure 1D:
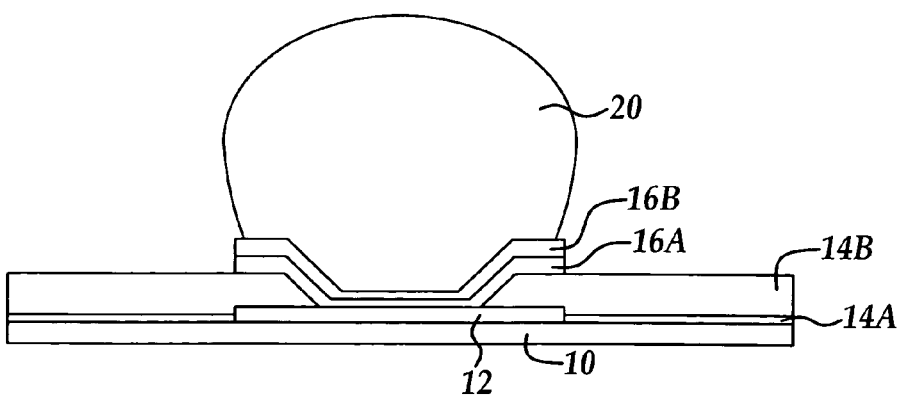

Referring to FIG. 1D, following the wet stripping process, conventional processes are carried out to form of a solder ball (bump) 20 including formation of a second patterned DFR layer (not shown) to leave an opening overlying the bonding pad 12 area followed by depositing solder material, for example a PbSn alloy, within the opening to contact the uppermost UBM wetting layer e.g., 16B. Subsequently, the second DFR layer is stripped including a wet stripping process followed by a solder reflow process, for example at a temperature greater than about 260° C. to form solder ball 20, for example a PbSn alloy, overlying and in contact with the uppermost UBM metal layer 16B.

Thus, an improved method has been presented for a solder bump formation process whereby gaseous bubble formation within the cross-linked polymer passivation layer is avoided thereby avoiding subsequent passivation layer peeling initiated in subsequent processes including a wet stripping process. For example, it has been found that the presence of surface defects, for example, creating protrusions of gaseous bubbles into the overlying UBM metal layers has been substantially eliminated according to embodiments of the present invention to produce a wafer defect rate of less than about 1% thereby increasing a wafer yield from about 80%, using a prior art curing process, to about 85% to about 99%.

Figure 2:
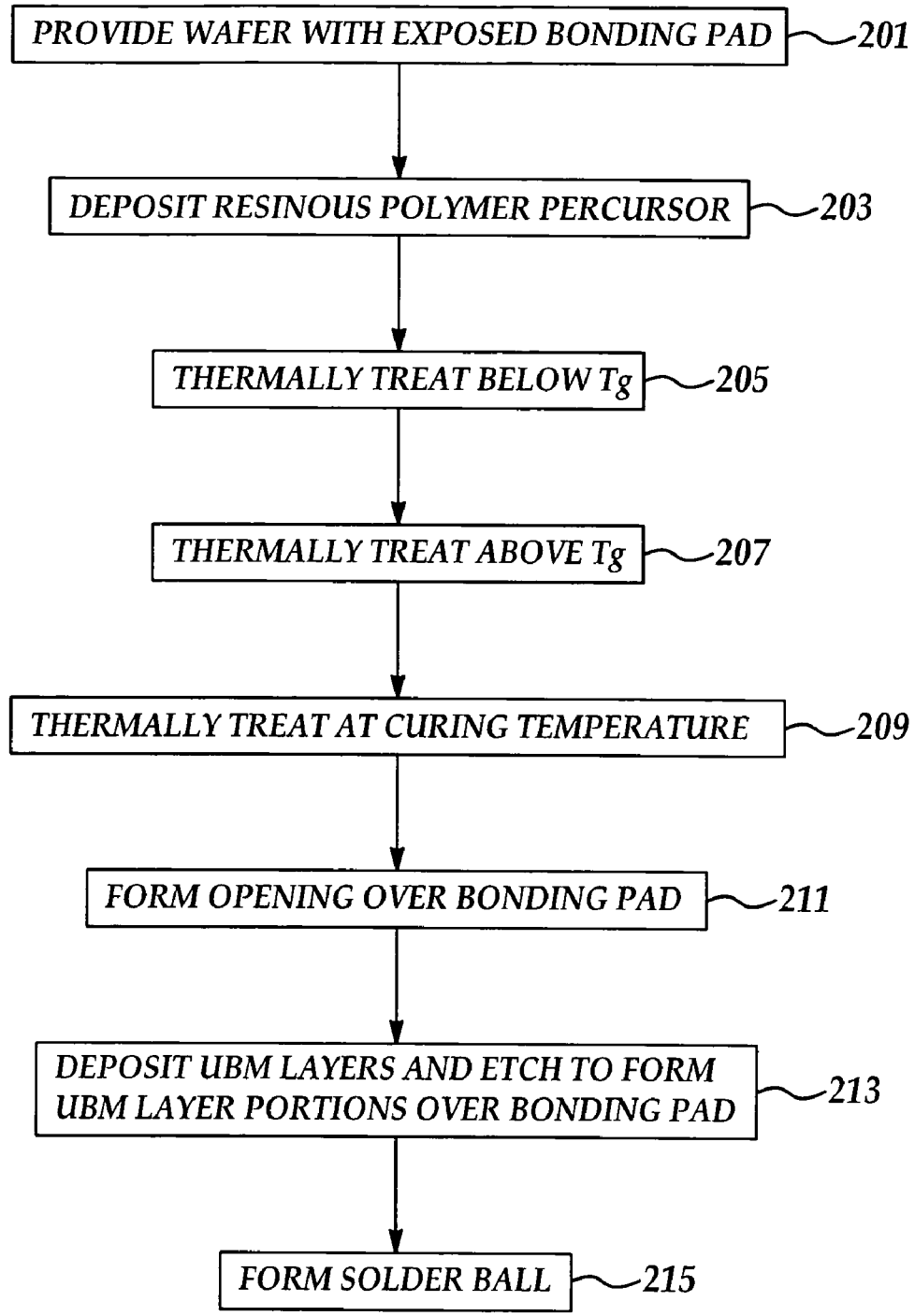
FIG. 2 is a process flow diagram including several embodiments of the present invention.

Referring to FIG. 2 is a process flow diagram including several embodiments of the present invention. In process 201 a process wafer is provided with an exposed bonding pad. In process 203, a resinous polymer precursor layer is coated over an uppermost surface including the bonding pad to form a passivation layer in a solder bump formation process. In process 205, a first pre-curing thermal treatment process is carried out below Tg. In process 207, a second pre-curing thermal treatment process is carried out above Tg, preferably not greater than 40° C. In process 209, a thermal treatment process is carried out at a curing temperature, preferably greater than about 40° C. above Tg. In process 211 an opening is formed in the passivation layer to expose a bonding pad portion. In process 213, UBM metal layers are deposited and etched to form UBM layer portions over the bonding pad. In process 215, a solder ball is formed overlying and contacting an uppermost UBM metal layer.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing peeling of a cross-linked polymer passivation layer in a solder bump formation process comprising the steps of:
providing a multi-level semiconductor device formed on a semiconductor process wafer having an uppermost surface comprising a metal bonding pad in electrical communication with underlying device levels;
forming a layer of resinous pre-cursor polymeric material over the process surface said resinous polymeric material having a glass transition temperature (Tg) upon curing;
subjecting the semiconductor process wafer to a pre-curing thermal treatment temperature below Tg for a period of time; and,
subjecting the semiconductor process wafer to at least one subsequent thermal treatment temperature above Tg for a period of time to form an uppermost passivation layer.

2. The method of claim 1, wherein the pre-curing thermal treatment temperature is within about 20° C. to about 60° C. of Tg.

3. The method of claim 1, wherein the subsequent thermal treatment temperature above Tg comprises a thermal curing treatment temperature of greater than about 40° C. above Tg.

4. The method of claim 3, wherein the pre-curing thermal treatment is carried out for a time period between about ⅕ and about 1/30 of the thermal curing treatment time period.

5. The method of claim 1, wherein the subsequent thermal treatment temperature above Tg comprises a second pre-curing thermal temperature of not greater than about 40° C. above Tg.

6. The method of claim 1, wherein Tg is between about 200° C. and about 300° C.

7. The method of claim 1, wherein the resinous pre-cursor polymeric material comprises a polyimide.

8. The method of claim 7, wherein Tg is between about 240° C. and about 300° C.

9. The method of claim 7, wherein the pre-curing thermal treatment comprises a treatment temperature between about 180° C. and about 220° C. for a period of from about 3 minutes to about 10 minutes and the thermal curing treatment comprises a temperature of from about 320° C. to about 370° C. for a period of from about 90 minutes to about 180 minutes.

10. The method of claim 1, further comprising the steps of:
forming an opening in the uppermost passivation layer to expose the metal bonding pad;
forming at least one layer of under bump metallurgy (UBM) over the passivation layer and metal bonding pad in a solder bump formation process;
photolithographically patterning a photoresist layer formed over the UBM and etching the at least one layer of UBM to leave a UBM portion overlying the bonding pad; and,
performing a wet stripping process to remove the photoresist layer the wet stripping process comprising at least one of an acidic and basic wet stripping solution.

11. The method of claim 10, wherein the photoresist comprises a dry film photoresist.

12. The method of claim 10, wherein the UBM comprises at least one of Ti, Cr, Al, Cu, CrCu, Ni, and NiV.

13. The method of claim 8, further comprising forming a solder ball over the UBM.

14. A method for reducing peeling of a polyimide polymer passivation layer in a solder bump formation process comprising the steps of:
providing a multi-level semiconductor device formed on a semiconductor process wafer having an uppermost surface comprising a metal bonding pad in electrical communication with underlying device levels;
forming a layer of resinous pre-cursor polyimide material over the process surface said resinous polyimide material having a glass transition temperature (Tg) upon forming a cross-linked structure;

subjecting the semiconductor process wafer to at least one pre-curing thermal treatment comprising a treatment temperature below Tg for a period of time to initiate polymeric cross-linking reactions; and, subjecting the semiconductor process wafer to a thermal curing treatment comprising a treatment temperature greater than about 40° C. above Tg for a period of time to form an uppermost passivation layer.

15. The method of claim 14, wherein the at least one pre-curing thermal treatment comprises a treatment temperature within about 20° C. to about 60° C. lower than Tg.

16. The method of claim 14, wherein the at least one pre-curing thermal treatment comprises a second treatment temperature within about 40° C. greater than Tg.

17. The method of claim 14, wherein the at least one pre-curing thermal treatment is carried out for a time period between about 1/5 and about 1/30 of the thermal curing treatment.

18. The method of claim 14, wherein Tg is between about 240° C. and about 300° C.

19. The method of claim 14, wherein the at least one pre-curing thermal treatment comprises a treatment temperature between about 180° C. and about 220° C. for a period of from about 3 minutes to about 10 minutes.

20. The method of claim 14, further comprising the steps of:

forming an opening in the uppermost passivation layer to expose the metal bonding pad;

forming at least one layer of under bump metallurgy (UBM) over the passivation layer and metal bonding pad in a solder bump formation process;

photolithographically patterning a photoresist layer formed over the UBM and etching the at least one layer of UBM to leave a UBM portion overlying the bonding pad;

performing a wet stripping process to remove the photoresist layer the wet stripping process comprising at least one of an acidic and basic wet stripping solution; and, forming a solder ball over the UBM.

* * * * *